United States Patent
Doumae

(10) Patent No.: US 7,238,592 B2
(45) Date of Patent: Jul. 3, 2007

(54) METHOD OF MANUFACTURING A SEMICONDUCTOR DEVICE HAVING AN ALIGNMENT MARK

(75) Inventor: Yasuhiro Doumae, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 234 days.

(21) Appl. No.: 10/942,828

(22) Filed: Sep. 17, 2004

(65) Prior Publication Data

US 2005/0170615 A1 Aug. 4, 2005

(30) Foreign Application Priority Data

Feb. 2, 2004 (JP) ............................. 2004-025581

(51) Int. Cl.
- H01L 21/76 (2006.01)
- H01L 21/78 (2006.01)
- H01L 21/46 (2006.01)
- H01L 21/00 (2006.01)
- H01L 23/544 (2006.01)

(52) U.S. Cl. ...................... 438/462; 438/401; 438/975; 257/797; 257/E23.179

(58) Field of Classification Search ............... 438/401, 438/462, 975; 257/797, E23.179
See application file for complete search history.

(56) References Cited

U.S. PATENT DOCUMENTS

| 5,369,050 A | * | 11/1994 | Kawai ........................ 438/401 |
| 5,869,383 A | * | 2/1999 | Chien et al. ................ 438/401 |
| 6,368,936 B1 | | 4/2002 | Yoshida |
| 6,737,315 B2 | * | 5/2004 | Kuroi et al. ................ 438/243 |
| 6,821,867 B2 | * | 11/2004 | Matsuura et al. ........... 438/462 |
| 2002/0182821 A1 | | 12/2002 | Yabe et al. |

FOREIGN PATENT DOCUMENTS

| JP | 62-128118 | 10/1987 |
| JP | 63-308916 | 12/1988 |
| JP | 2001-307999 | 11/2001 |
| JP | 2002-353120 | 12/2002 |

* cited by examiner

Primary Examiner—Luan Thai
(74) Attorney, Agent, or Firm—Volentine & Whitt, P.L.L.C.

(57) ABSTRACT

A method of manufacturing a semiconductor device includes providing a substrate and forming a projecting alignment mark. The substrate includes an insulating layer and a semiconductor layer on the insulating layer, and the substrate includes device areas and a scribe line area which surrounds the device area in the semiconductor layer. The projecting alignment mark is formed on the scribe line area.

9 Claims, 7 Drawing Sheets

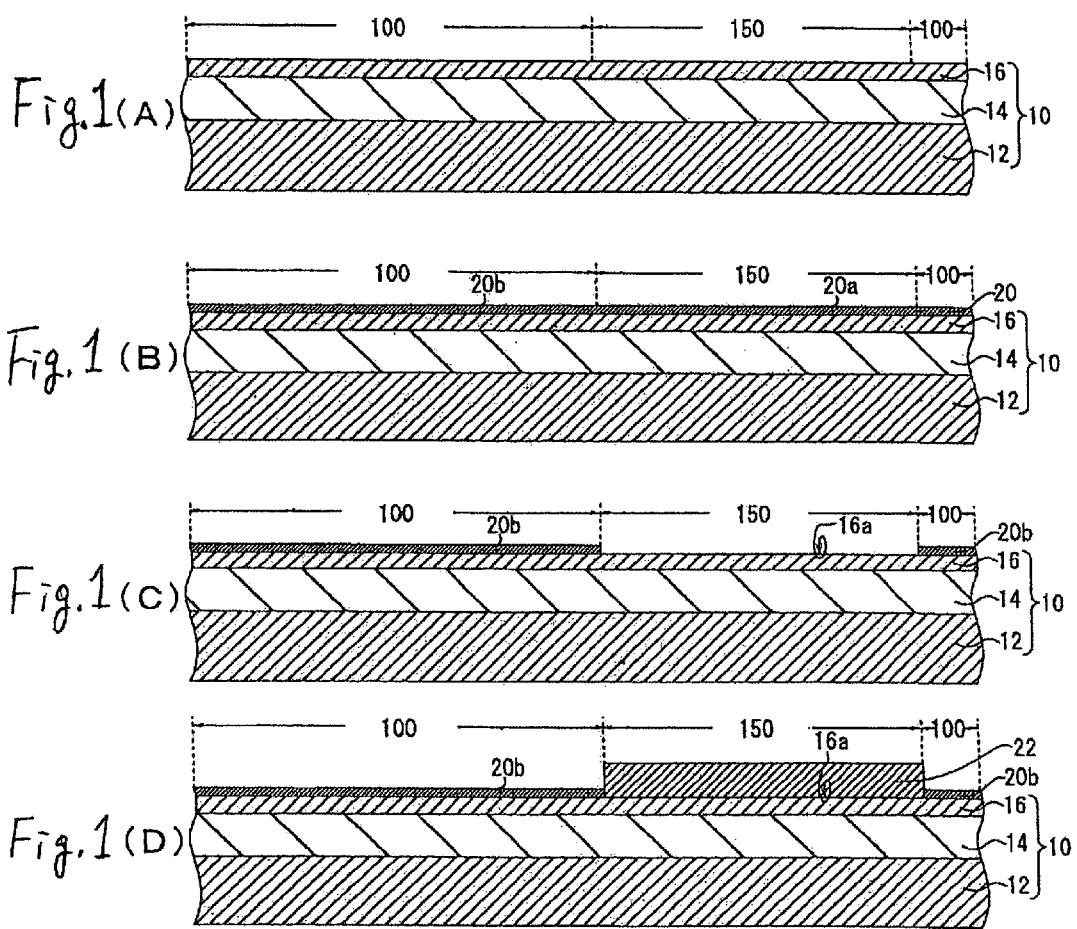

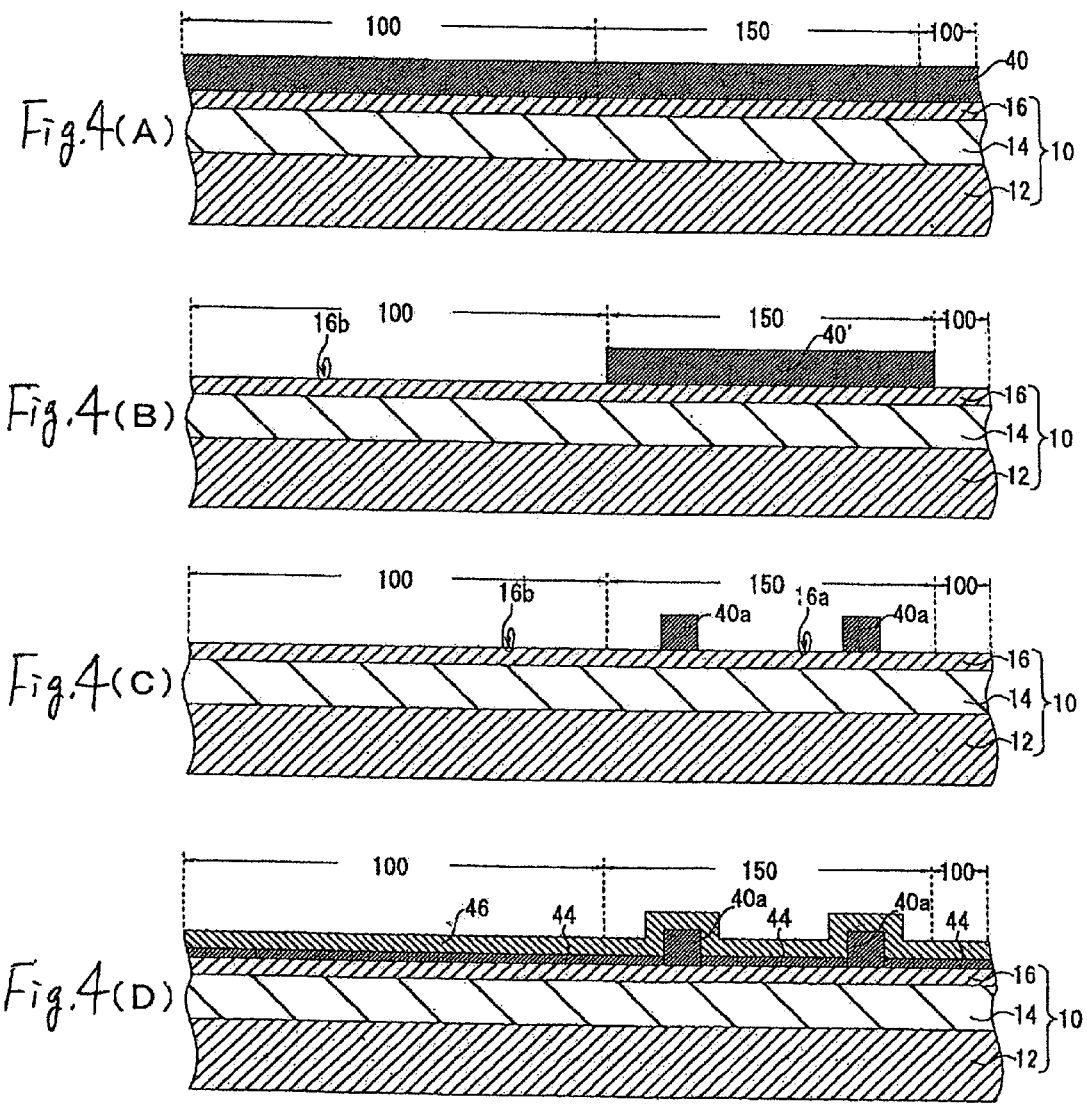

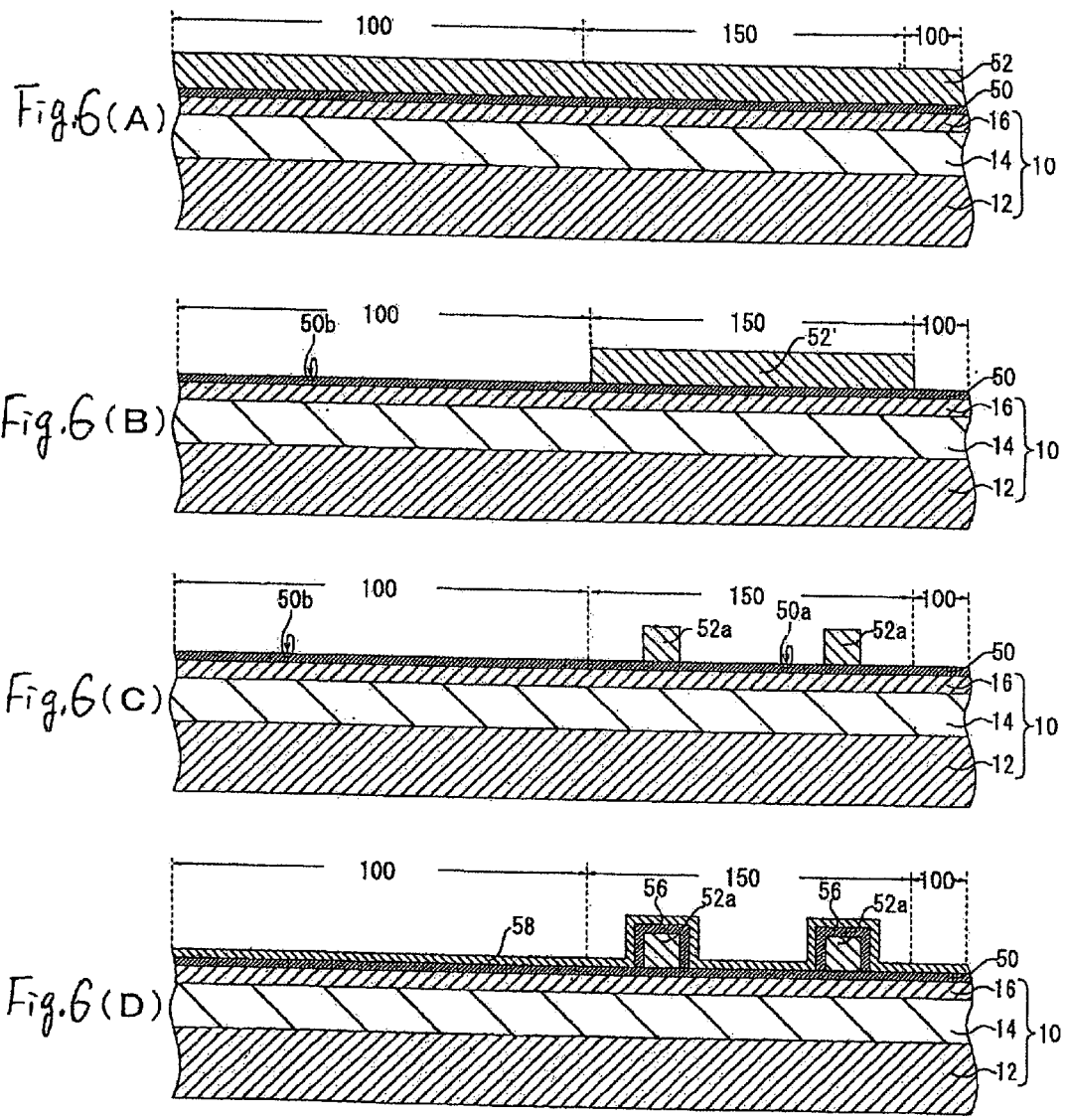

METHOD OF MANUFACTURING A SEMICONDUCTOR DEVICE HAVING AN ALIGNMENT MARK

CROSS REFERENCE TO RELATED APPLICATION

A claim of priority under 35 U.S.C. §119 is made to Japanese Patent Application No. 2004-25581, filed Feb. 2, 2004, which is herein incorporated by reference in its entirety for all purposes.

BACKGROUND OF THE INVENTION

1. Field of the Invention

The present invention relates to a method of manufacturing a semiconductor device which has an alignment mark.

2. Description of the Related Art

A photolithography method is commonly used for manufacturing a semiconductor device. In the photolithography method, a photoresist which is formed on a semiconductor wafer is exposed by using a photomask and developed for forming a circuit pattern. Then, a layer which is located under the photoresist is etched.

For example, a photomask may include a glass substrate and a circuit pattern of chrome which is formed on the glass substrate.

In the exposing step, the photomask must be aligned with the semiconductor wafer correctly. Alignment marks which are formed in the photomask and in the wafer are used for the alignment. The alignment mark which is formed in the photomask is aligned with the alignment mark which is formed in the semiconductor wafer, before performing the exposing step. The position of the alignment mark of the semiconductor wafer is detected by using a light that is reflected or diffracted from the alignment mark of the wafer. The reflected light or the diffracted light is made by emitting a light onto the alignment mark of the semiconductor wafer.

An alignment mark structure having a concave portion or a convex portion that is formed in a semiconductor wafer is disclosed in reference 1: Japanese Patent Laid-Open No. 62-128118.

An alignment mark structure having a convex portion which is formed in a semiconductor wafer, and having a light shielding film formed on the convex portion, is disclosed in reference 2: Japanese Patent Laid-Open No. 63-308916.

Recently, SOI(Silicon on Insulator) devices have been used for obtaining high performance semiconductor devices. An SOI device includes a silicon substrate, an insulating layer on the silicon substrate, and a thin silicon layer on the insulating layer. Circuit elements are formed in the thin silicon layer. SOI devices having high-speed operation and low power consumption can be obtained.

An alignment mark structure for an SOI device is disclosed in reference 3: Japanese Patent Laid-Open No. 2001-307999. The alignment mark which is disclosed in reference 3 is silicon dioxide which is embedded in the thin silicon layer.

Also, an alignment mark structure for an SOI device is disclosed in reference 4: Japanese Patent Laid-Open No. 2002-353120. The alignment mark which is disclosed in reference 4 is a concave portion which penetrates to the silicon substrate.

Recently however, a thickness of the thin silicon layer has been reduced for inhibiting a short channel effect of a transistor which is formed in the SOI substrate. As a result, a depth of an alignment mark which is formed in the thin silicon layer is not enough for detecting. Also, the alignment mark which is formed in the thin silicon layer might be removed in a manufacturing step.

SUMMARY OF THE INVENTION

Accordingly, in one aspect of the present invention, a method of manufacturing a semiconductor device includes providing a substrate and forming a projecting alignment mark. The substrate includes an insulating layer and a semiconductor layer on the insulating layer, and the substrate includes device areas and a scribe line area which surrounds the device area in the semiconductor layer. The projecting alignment mark is formed on the scribe line area.

BRIEF DESCRIPTION OF THE DRAWINGS

FIG. 1(A) to FIG. 1(D) are cross-sectional views showing manufacturing steps of a first embodiment of a present invention.

FIG. 4(A) to FIG. 4(D) are cross-sectional views showing manufacturing steps of a second embodiment of the present invention.

FIG. 6(A) to FIG. 6(D) are cross-sectional views showing manufacturing steps of a third embodiment of the present invention.

DETAILED DESCRIPTION OF THE PREFERRED EMBODIMENTS

Figure 2A:
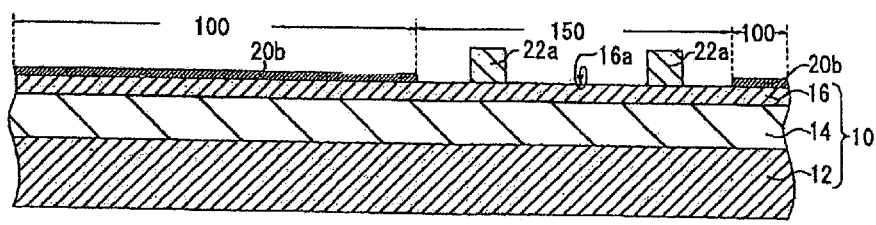
FIG. 2(A) to FIG. 2(D) are cross-sectional views showing manufacturing steps of the first embodiment of the present invention.

A method of manufacturing a semiconductor device according to preferred embodiments of the present invention will be explained hereinafter with reference to the accompanying figures. In order to simplify the explanation, like elements are given like or corresponding reference numerals. Dual explanations of the same elements are avoided.

A method of manufacturing a semiconductor device of a first embodiment is described by referring to FIG. 1(A) to FIG. 3(B).

Figure 2B:
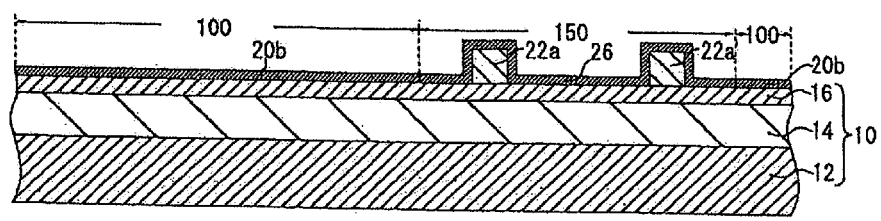
Figure 2C:
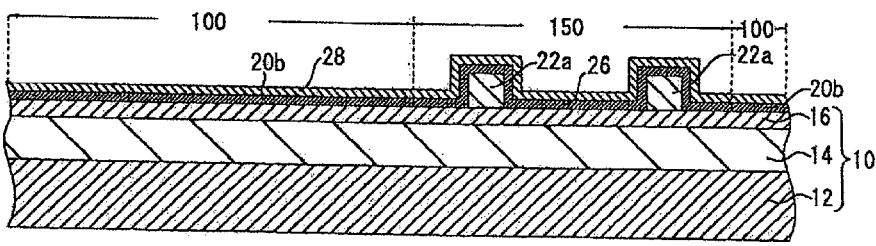
Figure 2D:
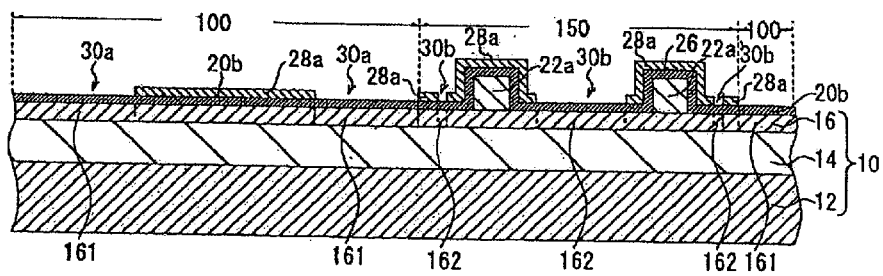
Figure 3A:
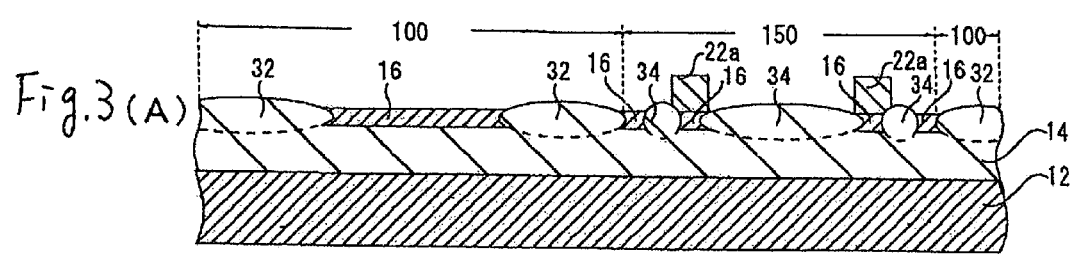
FIG. 3(A) is a cross-sectional view showing manufacturing steps of the first embodiment of the present invention.
Figure 3B:
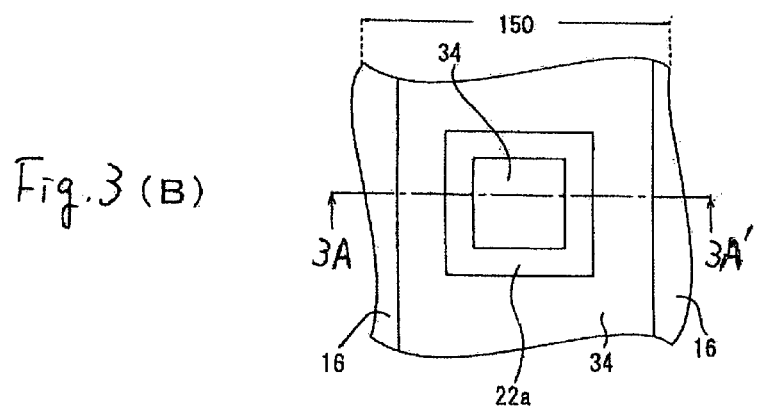
FIG. 3(B) is a plane view showing an alignment mark of the first embodiment.

FIG. 1(A) to FIG. 3(A) are cross-sectional views showing manufacturing steps of the first embodiment. FIG. 3(B) is a plane view showing an alignment mark of the first embodiment. An alignment mark portion 150 in FIG. 3(A) is the cross-sectional view taken along line 3A–3A' in FIG. 3(B).

First, an SOI(Silicon on Insulator) substrate 10 is provided. The SOI substrate 10 includes a first silicon layer 12, an insulating layer 14 such as silicon dioxide, and a second silicon layer 16. The insulating layer 14 is sandwiched between the first silicon layer 12 and the second silicon layer 16.

The first silicon layer has 200 nm thickness and the second silicon layer has 10 nm thickness. An SOS(Silicon on Sapphire) substrate or an SOQ(Silicon on Quartz) substrate can be used as the SOI substrate.

The SOI substrate 10 includes device areas 100 and scribe line area 150 as shown in FIG. 1(A). The scribe line area 150 is located around the device area 100.

Then, a silicon dioxide layer 20 is formed on the second silicon layer 16 by thermal oxidation as shown in FIG. 1(B). A thickness of the silicon dioxide layer 20 has a range from 10 nm to 30 nm. A part of the silicon dioxide layer which is located in the scribe line area 150 is shown by reference number 20a, and a part of the silicon dioxide layer 20 which is located in the device area 100 is shown by reference number 20b.

Then, the silicon dioxide layer 20a which is located in the scribe line area 150 is removed by etching as shown in FIG. 1(C). A photoresist layer (not shown) is formed on the silicon dioxide layer 20b before the etching step. The photoresist layer (not shown) is removed after the etching.

Then, an epitaxial silicon layer 22 is formed on the silicon layer 16 which is exposed from the silicon dioxide layer 20b by an epitaxial growth method. That is, the epitaxial silicon layer 22 is formed in the scribe line area 150 as shown in FIG. 1(D).

The epitaxial silicon layer is formed by introducing $SiH_2Cl_2$ and HCl in a chamber under a nitrogen purge. The $SiH_2Cl_2$ is a source of the silicon crystalline and the HCl inhibits the growth of the epitaxial silicon layer 22 on the silicon dioxide layer 20b. A thickness of the epitaxial silicon layer 22 with the silicon layer 16 is 100 nm or more.

Then, the epitaxial silicon layer 22 is patterned by etching to obtain a frame shaped projection portion 22a as shown in FIG. 2(A). The patterning step is performed by using a photoresist which is formed on the epitaxial silicon layer 22. The photoresist is removed after etching.

Then, silicon dioxide layer 26 is formed on the second silicon layer 16a and the projection portion 22a by thermal oxidation as shown in FIG. 2(B). A thickness of the silicon dioxide is 15 nm. The silicon dioxide layer 20b and the silicon dioxide layer 26 inhibit mixing of impurities to the SOI substrate 10.

Then, a silicon nitride layer 28 is formed on the silicon dioxide layer 20b and the silicon dioxide layer 26 as shown in FIG. 2(C). The silicon nitride layer 28 is made by a CVD(Chemical Vapor Deposition) method. A thickness of the silicon nitride layer 28 is in a range from 150 nm to 200 nm. The silicon dioxide layer 26 reduces a stress between the SOI substrate 10 and the silicon nitride layer 28.

Then, a part of the silicon nitride layer 28 which is adjacent to the projection portion 22a in the scribe line area 150, and adjacent to the peripheral areas of element forming area, are removed by etching as shown in FIG. 2(D). The etching is performed after forming a patterned photoresist layer (not shown) on the silicon nitride layer 28, and the photoresist layer is removed after etching.

Then, portions of the second silicon layer 16 which correspond to openings 30a and 30b which are formed by the remaining silicon nitride layer 28a are oxidized by thermal oxidation. In this oxidation step, isolating layers 32 are formed. Then, the remaining silicon nitride layer 28a is removed by wet etching by using $H_3PO_4$. As a result, the projection portion 22a which has a step suitable for the alignment mark is obtained as shown in FIG. 3(A). The projection portion 22a is surrounded by the silicon dioxide layer 34.

A material of the projection portion 22a is different from a material of the silicon dioxide layer 34. Therefore, a contrast between the projection portion 22a and the other areas is increased. As a result, the projection portion 22a can be detected correctly.

Next, a method of manufacturing a semiconductor device of a second embodiment is described by referring to FIG. 4(A) to FIG. 5(C).

Figure 5A:
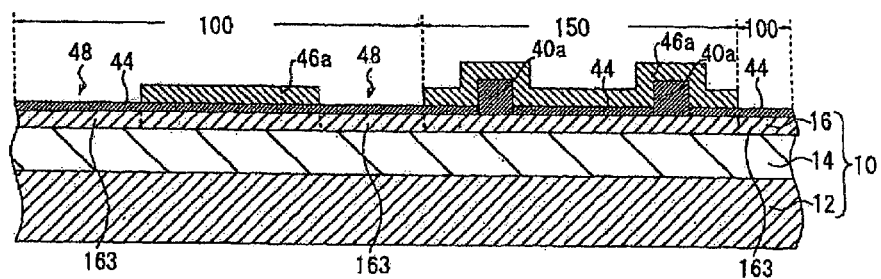
FIG. 5(A) to FIG. 5(B) are cross-sectional views showing manufacturing steps of the second embodiment of the present invention.
Figure 5B:
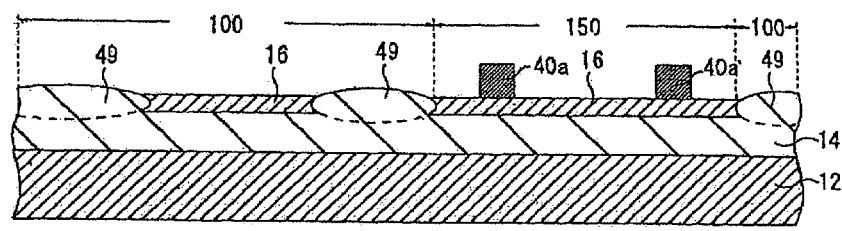

FIG. 4(A) to FIG. 5(B) are cross-sectional views showing manufacturing steps of the second embodiment. FIG. 5(C) is a plane view showing an alignment mark of the second embodiment. An alignment mark portion 150 in FIG. 5(B) is the cross-sectional view taken along line 5B–5B' in FIG. 5(C).

First, the SOI substrate 10 which is disclosed in FIG. 1(A) is provided. Then, a silicon dioxide layer 40 is formed on the silicon layer 16 as shown in FIG. 4(A). A thickness of the silicon dioxide layer 40 is set at an enough thickness for using as an alignment mark. Preferably, the thickness of the silicon dioxide layer 40 is 100 nm or more. The silicon dioxide layer 40 is formed by thermal oxidation or the CVD method.

Then, the silicon dioxide layer 40 which is located on the device area 100 is removed by etching as shown in FIG. 4(B). As a result, a surface 16b of the silicon layer 16 is exposed from the remaining silicon dioxide layer 40' which is located on the scribe area 150. The etching step is performed by using a photoresist which is formed on the silicon dioxide layer 40. The photoresist is removed after etching.

Then, the silicon dioxide layer 40' is patterned by etching to obtain a frame shaped projection portion 40a as shown in FIG. 4(C). The patterning step is performed by using a photoresist which is formed on the silicon dioxide layer 40'. The photoresist is removed after etching.

Then, a silicon dioxide layer 44 is formed on the surface 16a and the surface 16b of the silicon layer 16 by thermal oxidation. A thickness of the silicon dioxide layer 44 is 15 nm. Then, a silicon nitride layer 46 is formed on the silicon dioxide layer 44 by the CVD method as shown in FIG. 4(D). A thickness of the silicon nitride is in a range from 150 nm to 200 nm.

Then, the silicon nitride layer 46 is patterned by etching so that a part of the silicon dioxide layer 44 is exposed from the remaining silicon nitride layer 46a as shown in FIG. 5(A). In this patterning, openings 48 are formed in the silicon nitride layer 46. The patterning step is performed by using a photoresist which is formed on the silicon nitride layer 46. The photoresist is removed after etching.

Then, a part of the silicon layer 16 which correspond to the openings 48 is oxidized by thermal oxidation, so that an isolation layer 49 is formed in the device area 100, as shown in FIG. 5(B). Then, the remaining silicon nitride layer 46a is etched by using hot phosphoric acid. Then, the silicon dioxide layer 44 is etched by using a solution which includes hydrogen fluoride.

Figure 5C:
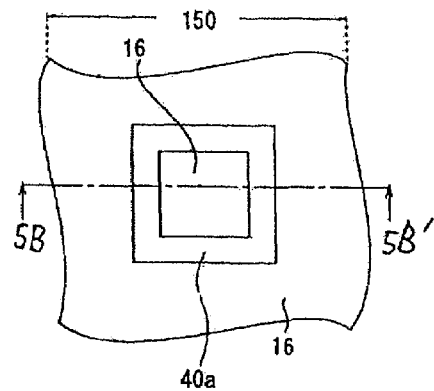
FIG. 5(C) is a plane view showing an alignment mark of the second embodiment.

As a result, the projection portion 40a which has an step suitable for the alignment mark is obtained as shown in FIG. 5(B). The projection portion 40a which is made of silicon dioxide is located on the silicon layer 16 as shown in FIG. 5(C). Since a material of the projection portion 40a is different from a material of the silicon layer 16, a contrast between the projection portion 40a and the other areas is increased. As a result, the projection portion 40a can be detected correctly.

Next, a method of manufacturing a semiconductor device of a third embodiment is described by referring to FIG. 6(A) to FIG. 7(C).

Figure 7A:
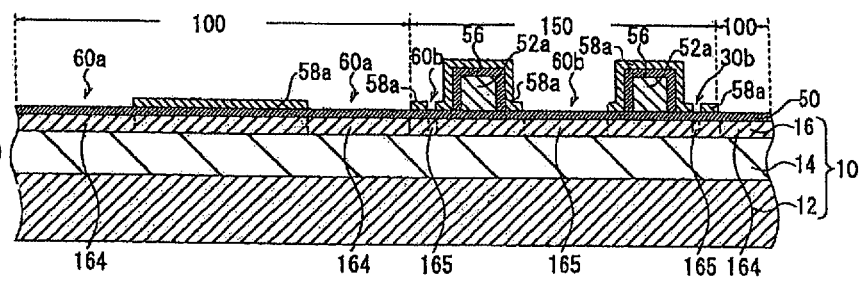
FIG. 7(A) to FIG. 7(B) are cross-sectional views showing manufacturing steps of the third embodiment of the present invention.
Figure 7B:
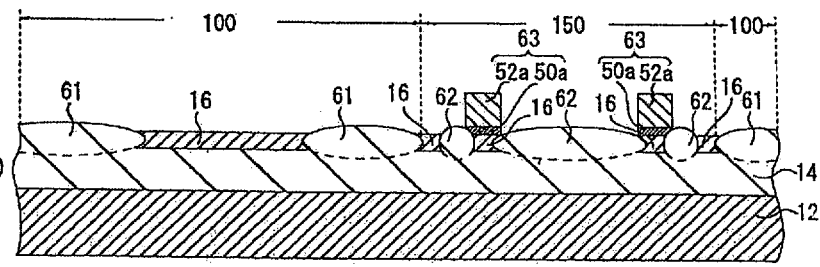

FIG. 6(A) to FIG. 7(B) are cross-sectional views showing manufacturing steps of the third embodiment. FIG. 7(C) is a plane view showing an alignment mark of the third embodiment. An alignment mark portion 150 in FIG. 7(B) is the cross-sectional view taken along line 7B–7B' in FIG. 7(C).

First, the SOI substrate 10 which is disclosed in FIG. 1(A) is provided. Then, a silicon dioxide layer 50 is formed on the second silicon layer 16.

Then, a polycrystalline silicon layer 52 is formed on the silicon dioxide layer 50 by the CVD method as shown in FIG. 6(A). A thickness of the polycrystalline silicon payers 52 is set a thickness suitable for using as an alignment mark. Preferably, the thickness of the polycrystalline silicon layer 52 is 100 nm or more.

Then, the polycrystalline silicon layer 52 which is located on the device area 100 is removed by etching as shown in FIG. 6(B). As a result, a surface 50b of the silicon dioxide layer 50 is exposed from the remaining polycrystalline silicon layer 52' which is located on the scribe area 150. The etching step is performed by using a photoresist which is formed on the polycrystalline silicon layer 52. The photoresist is removed after etching.

Then, the polycrystalline silicon layer 52' is patterned by etching to obtain a frame shaped projection portion 52a as shown in FIG. 6(C). The patterning step is performed by using a photoresist which is formed on the polycrystalline silicon layer 52'. The photoresist is removed after etching.

Then, a silicon dioxide layer 56 is formed on the projection portion 52a by thermal oxidation. A thickness of the silicon dioxide layer 56 is 15 nm. Then, a silicon nitride layer 58 is formed on the silicon dioxide layers 50 and 56 by the CVD method as shown in FIG. 6(D). A thickness of the silicon nitride is a range from 150 nm to 200 nm.

Then, the silicon nitride layer 58 is patterned by etching so that a part of the silicon dioxide layer 50 is exposed from the remaining silicon nitride layer 58a as shown in FIG. 7(A). In this patterning, openings 60a and 60b are formed in the silicon nitride layer 58. The patterning step is performed by using a photoresist which is formed on the silicon nitride layer 46. The photoresist is removed after etching.

Then, a part of the silicon layer 16 which correspond to the openings 60a and 60b are oxidized by thermal oxidation, so that a silicon dioxide layer 61 is formed in the device area 100 and the scribe line area 150, as shown in FIG. 7(B). Then, the remaining silicon nitride layer 58a is etched by using hot phosphoric acid. Then, the silicon dioxide layers 50 and 56 are etched by using a solution which includes hydrogen fluoride.

Figure 7C:
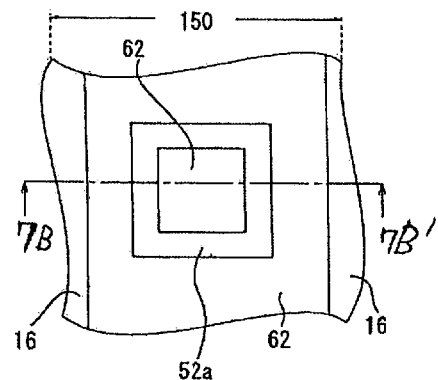
FIG. 7(C) is a plane view showing an alignment mark of the third embodiment.

As a result, the projection portion 52a with the remaining silicon dioxide layer 50a which having a step suitable for the alignment mark is obtained as shown in FIG. 7(B). That is, the alignment mark of this embodiment includes the projection portion 52a and the silicon dioxide layer portion 50a which is located under the projection portion 52a. The projection portion 52a which is made of polycrystalline silicon is surrounded by the silicon dioxide layer 62 as shown in FIG. 7(C). Since a material of the projection portion 52a is different from a material of the silicon dioxide layer 62, a contrast between the projection portion 52a and the other areas is increased. As a result, the projection portion 52a can be detected correctly.

Further, since the silicon dioxide layer 50 is formed under the polycrystalline silicon layer 52, the silicon layer 16 is not etched, when the patterning step for forming the projection portion 52a is performed.

While the preferred form of the present invention has been described, it is to be understood that modifications will be apparent to those skilled in the art without departing from the spirit of the invention. The scope of the invention is to be determined solely by the following claims.

What is claimed is:

1. A method manufacturing a semiconductor device comprising:
   providing a substrate which has an insulating layer and a semiconductor layer on the insulating layer, wherein the substrate has a device area and a scribe line area which surrounds the device area in the semiconductor layer; and
   forming a projecting alignment mark on the scribe line area, said forming a projection alignment mark comprising
   forming a silicon dioxide layer on the semiconductor layer,
   removing a portion of the silicon dioxide layer to form a window that exposes the semiconductor layer at the scribe line area,
   forming an alignment mark layer in the window, and
   patterning the alignment mark layer into a frame-shaped portion, wherein the alignment mark layer is made by an epitaxial growth method.

2. The method of claim 1, wherein the alignment mark layer is made of silicon.

3. The method of claim 1, wherein the alignment mark layer is made of poly crystalline silicon.

4. The method of claim 1, further comprising oxidizing the semiconductor layer which is adjacent to the projecting alignment mark.

5. The method of claim 4, wherein said oxidizing the semiconductor layer forms an isolating layer.

6. A method manufacturing a semiconductor device comprising:
   providing a substrate which has an insulating layer and a semiconductor layer on the insulating layer, wherein the substrate has a device area and a scribe line area which surrounds the device area in the semiconductor layer; and
   forming a projecting alignment mark on the scribe line area, said forming a projecting alignment mark comprising
   forming a silicon dioxide layer on the semiconductor layer,
   removing a portion of the silicon dioxide layer to form a window that exposes the semiconductor layer at the scribe line area,
   forming an alignment mark layer in the window by an epitaxial growth method,
   patterning the alignment mark layer into a frame-shaped portion,
   forming a second silicon dioxide layer on the alignment mark,
   forming a silicon nitride layer on the second silicon dioxide layer,
   removing portions of the silicon nitride layer within the scribe line area adjacent the frame-shaped portion and within peripheral areas of the device area to form openings, and
   oxidizing portions of semiconductor layer through the openings.

7. The method of claim 6, wherein the alignment mark layer is made of silicon.

8. The method of claim 6, wherein the alignment mark layer is made of poly crystalline silicon.

9. The method of claim 6, wherein said oxidizing the semiconductor layer forms an isolating layer.

* * * * *